(12) United States Patent
Sato et al.

(10) Patent No.: US 8,801,439 B2
(45) Date of Patent: Aug. 12, 2014

(54) MODULE SOCKET

(75) Inventors: Eriko Sato, Tokyo (JP); Toshihiro Niitsu, Tokyo (JP); Hirokazu Suzuki, Tokyo (JP); Akihiro Tezuka, Tokyo (JP); Hideo Nagasawa, Kanagawa (JP)

(73) Assignee: Molex Incorporated, Lisle, IL (US)

( * ) Notice: Subject to any disclaimer, the term of this patent is extended or adjusted under 35 U.S.C. 154(b) by 167 days.

(21) Appl. No.: 13/451,747

(22) Filed: Apr. 20, 2012

(65) Prior Publication Data

US 2012/0295484 A1   Nov. 22, 2012

(30) Foreign Application Priority Data

Apr. 20, 2011   (JP) .................................. 2011-093570

(51) Int. Cl.
*H01R 12/00* (2006.01)
*H05K 7/10* (2006.01)
*H01R 13/193* (2006.01)

(52) U.S. Cl.
CPC ............ *H05K 7/1069* (2013.01); *H01R 13/193* (2013.01)
USPC ........................................... 439/71; 439/342

(58) Field of Classification Search
CPC ... H05K 7/1069; H01R 23/722; H01R 13/193
USPC .................. 439/70, 71, 342, 376, 638
See application file for complete search history.

(56) References Cited

U.S. PATENT DOCUMENTS

| | | | | |
|---|---|---|---|---|
| 5,251,329 A * | 10/1993 | Takagi et al. | ................. | 455/572 |
| 6,181,032 B1 * | 1/2001 | Marshall et al. | ............. | 307/150 |
| 2005/0239314 A1 * | 10/2005 | Malone et al. | ................ | 439/342 |
| 2006/0110968 A1 * | 5/2006 | Miller et al. | ................. | 439/342 |
| 2006/0141841 A1 * | 6/2006 | Liao et al. | ..................... | 439/342 |

FOREIGN PATENT DOCUMENTS

JP   2007-026765 A   2/2007

* cited by examiner

*Primary Examiner* — Khiem Nguyen
(74) *Attorney, Agent, or Firm* — Timothy M. Morella

(57) ABSTRACT

The Present Disclosure is a module socket for mounting a module on a mounting member, in which the module socket has a first connector including a flat housing, a first conductive pattern arranged on the mating side surface of the housing, and a male terminal protruding from a surface of the first conductive pattern, and a flat second connector formed from plate-shaped metal and including a female terminal elastically interposing the male terminal, and in which either the first conductor or the second conductor is attached to the module and the other is attached to the mounting member.

12 Claims, 16 Drawing Sheets

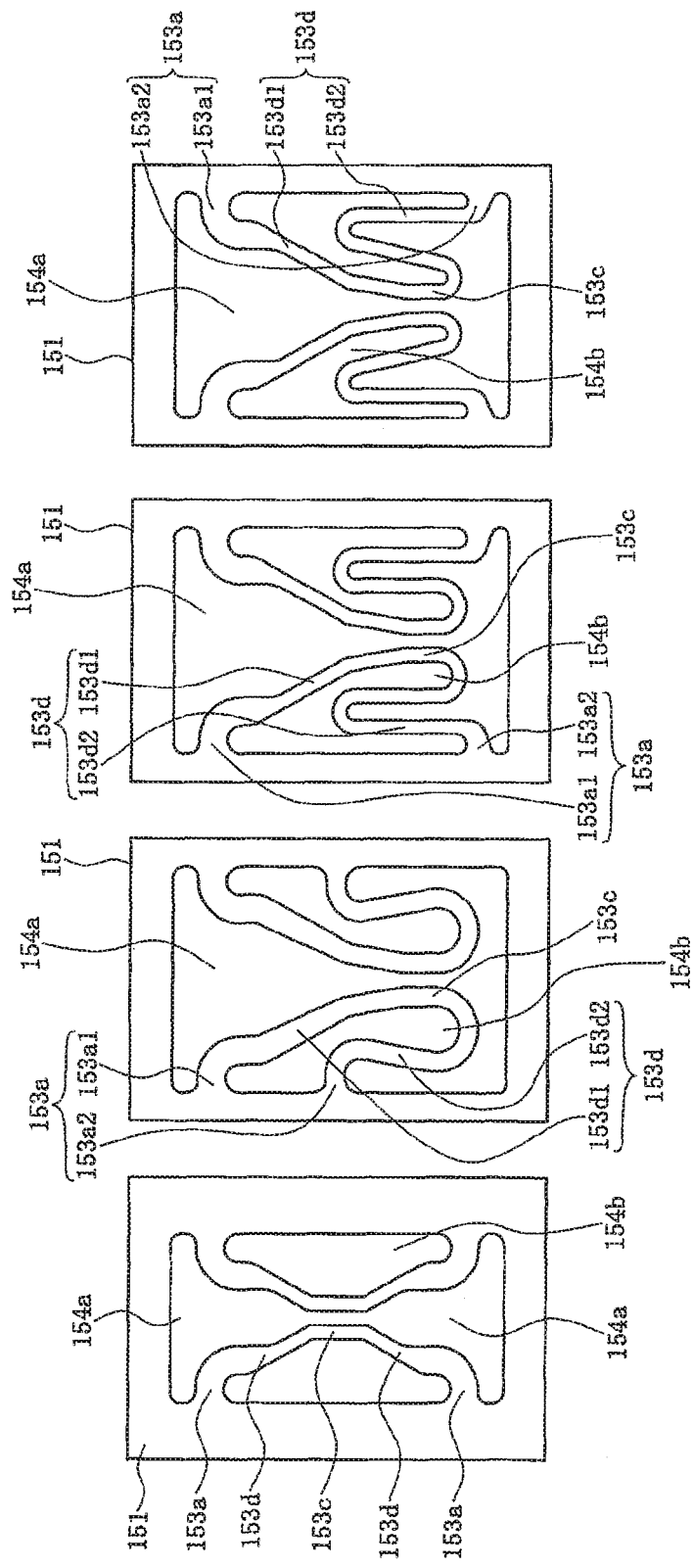

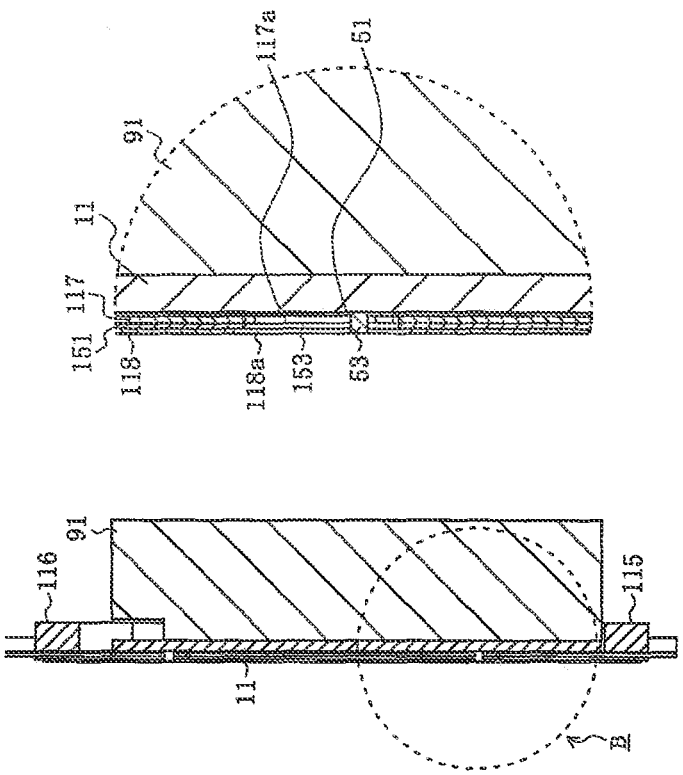
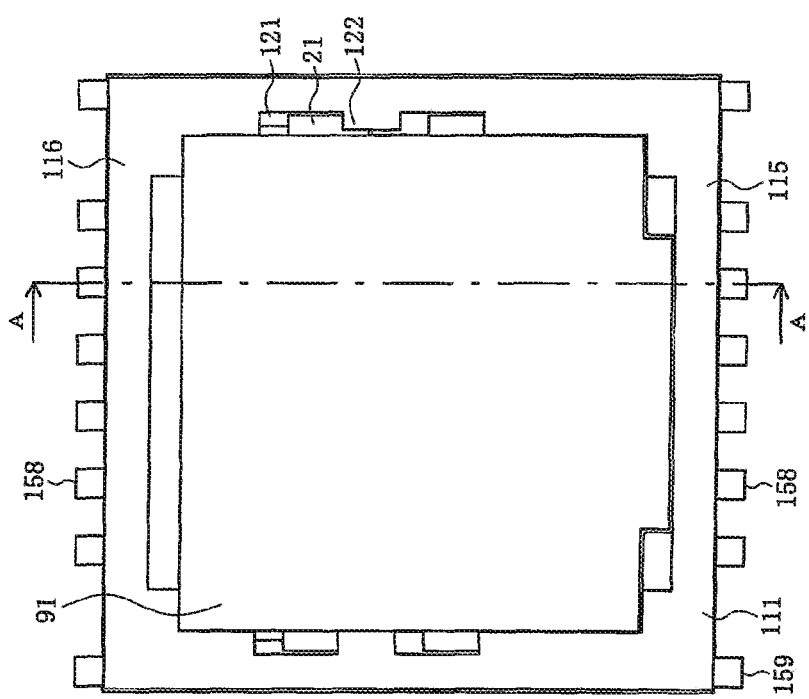
FIG. 8C    FIG. 8B    FIG. 8A

MODULE SOCKET

REFERENCE TO RELATED APPLICATIONS

The Present Disclosure claims priority to prior-filed Japanese Patent Application No. 2011-093570, entitled "Module Socket," filed on 20 Apr. 2011 with the Japanese Patent Office. The content of the aforementioned Patent Application is incorporated in its entirety herein.

BACKGROUND OF THE PRESENT DISCLOSURE

The Present Disclosure relates, generally, to a module socket.

A module socket is used to mount a module (e.g., a camera module) with an optical element (e.g., as a lens) and an image pickup device (e.g., a charge coupled device (CCD) or complementary metal oxide semiconductor (CMOS) image sensor) on a board inside a small electronic device (e.g., a personal computer, cell phone, a personal digital assistant (PDA), a gaming device or a navigation device). An example of such a socket is disclosed in Japanese Patent Application No. 2005-204351, the content of which is incorporated in its entirety herein.

FIG. 16 illustrates a cross-sectional view of a conventional module socket. In FIG. 16, 911 is a socket housing for a module socket, which has a flat bottom plate 917 and a circumferential wall 916 rising from the circumferential edge of the bottom plate 917. This housing is a box-shaped component made of a resin with an open top. A plurality of contact insertion grooves 918 open on the bottom are formed in the circumferential wall 916, and a contact 961 is accommodated and held as a terminal inside each contact insertion groove 918. A contact 961 has a tail 962 soldered to a connection pad on the base 991, and a cantilevered arm 968 with resilience. A contact portion 964 near the tip of the arm 968 protrudes upward from the upper surface of the bottom plate 917.

The outside of the circumferential wall 916 is covered by a shielding component 971. An elastic engagement piece 977 is integrally connected to the upper end of the shielding component 971. The elastic engagement piece 977 is positioned along the entire inside of the circumferential wall 916, and the upper end is bent substantially in the shape of the letter U, and connected to the upper end of the shielding component 971. The lower end faces the bottom plate 917.

Also, 801 is a camera module which has a main unit 811 and a lens tube 812, and which is accommodated inside the socket housing 911 and secured. Here, a contact pad formed on the bottom surface of the main unit 811 comes into contact with a contact portion 964 on the corresponding contact 961. The upper surface of the engaging protrusion 817 formed on a side surface of the main unit 811 engages the lower end of the elastic engagement piece 977. In this state, the bottom surface of the main unit 811 is biased upward by the spring action of the arm 968 on the contact 961, and the engaging protrusion 817 is biased downward by the spring action of the elastic engagement piece 977. As a result, the camera module 801 is elastically interposed from above and below, and is secured stably inside the socket housing 911.

However, in a module socket of the prior art, the camera module 801 is interposed from above and below by the spring action of the arm 968 of the contact 961 and the elastic engagement piece 977. Thus, the spring in the arm 968 of the contact 961 and the elastic engagement piece 977 has to be long enough to provide this spring action. This increases the dimensions of the module socket in the height direction.

Because the socket housing 911 and the shielding component 971 surround the camera module 801, the dimensions of the module socket in the vertical direction and the horizontal direction are also larger.

SUMMARY OF THE PRESENT DISCLOSURE

A purpose of the Present Disclosure is to provide a module socket that solves the aforementioned problems by providing a first connector with a protruding male terminal formed from plate-shaped metal, and a second connector with a female terminal for elastically interposing the male terminal, so that one of the connectors is attached to the module, and the other is attached to the mounted member. The connectors are mated with each other to reduce dimensions in the vertical, horizontal, and height directions, maintain stable contact between the male terminal and the female terminal, providing for easy manufacturing, simplified configuration, lower costs, a reduction in overall size and improved reliability.

The Present Disclosure is a module socket for mounting a module on a mounting member, in which the module socket has a first connector including a flat housing, a first conductive pattern arranged on the mating side surface of the housing, and a male terminal protruding from a surface of the first conductive pattern, and a flat second connector formed from plate-shaped metal and including a female terminal elastically interposing the male terminal, and in which either the first conductor or the second conductor is attached to the module and the other is attached to the mounting member.

In another module socket, the first connector and the second connector are mated by sliding mating side surfaces facing each other. In yet another module socket, the female terminal is formed by patterning a second conductive pattern in plate-shaped metal, and includes an inner opening formed on the inside, a base connected to a portion of the second conductive pattern surrounding the female terminal, a pair of contacts facing each other, and an arm connecting the contacts to the base. The interval between the pair of contacts facing each other is smaller than the width dimension of the inner opening and the width dimension of the male terminal, and the male terminal is elastically interposed on both sides by the pair of contacts when the female terminal engages the male terminal.

In still another module socket, the second connector includes a frame surrounding the periphery, and a flat connection recess having a periphery demarcated by the frame, and the first connector is accommodated in the connection recess. In still another module socket, the first connector includes a male mating lock protruding outward in the width direction, and the male mating lock engages a female mating lock formed in the frame, and the mated first connector and second connector are locked. In still another module socket, the second connector does not include a frame surrounding the periphery, the first connector includes a male mating lock protruding outward in the width direction, and the male mating lock engages a female mating lock formed in the second connector, and the mated first connector and second connector are locked.

In the Present Disclosure, the module socket has a first connector with a protruding male terminal formed from plate-shaped metal, and a second connector with a female terminal for elastically interposing the male terminal, so that one of the connectors is attached to the module, the other is attached to the mounted member, and the connectors are mated with each other. This reduces dimensions in the vertical, horizontal and height directions, maintains stable contact between the male terminal and the female terminal, provides for easy manufacturing, simplifies the configuration, lowers costs, reduces the overall size and improves reliability.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which:

FIG. 5 is a top view showing female terminals for the second connector of FIG. 1;

FIG. 8 is a views showing completed mating steps of the first and second connectors of FIG. 1, in which (a) is a top view, (b) is a cross-sectional side view from Line A-A in (a), and (c) is an enlarged view of Section B in (b);

DESCRIPTION OF THE PREFERRED EMBODIMENTS

Figures 1A, 1B:
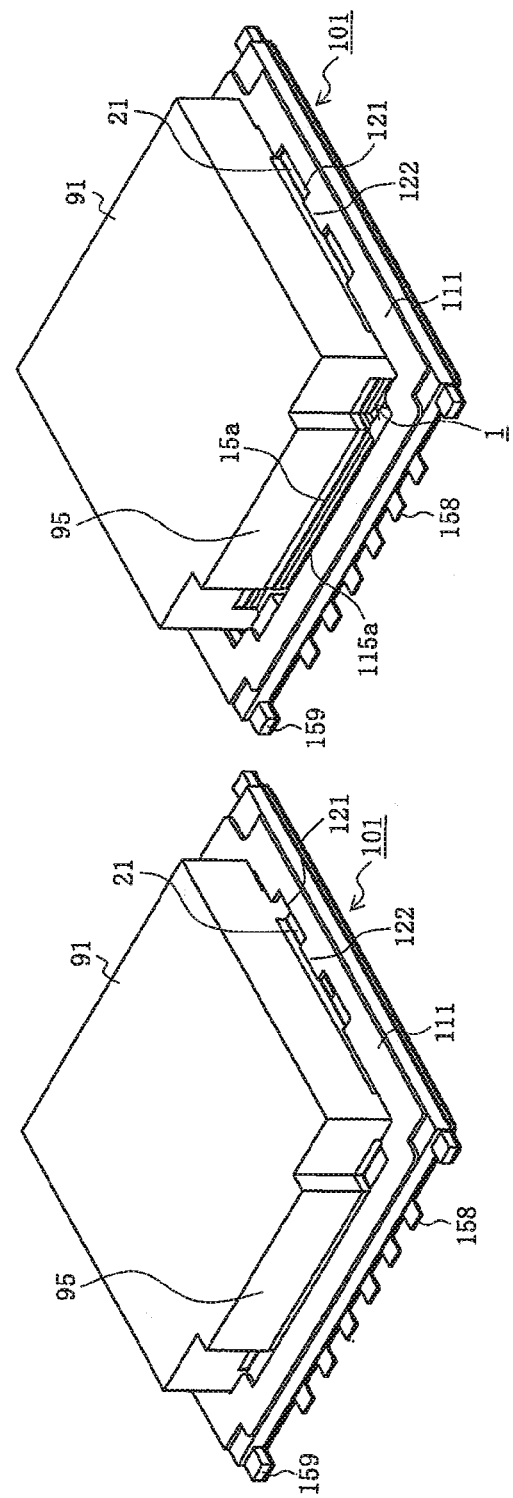
FIG. 1 is a perspective view of a module mounted in the module socket according to the Present Disclosure, in which (a) shows the module before mating has been completed, and (b) shows the module after mating has been completed.

While the Present Disclosure may be susceptible to embodiment in different forms, there is shown in the Figures, and will be described herein in detail, specific embodiments, with the understanding that the disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Referring to FIGS. 1-5, 1 is the male connector serving as the first connector of the module socket in this embodiment. This mates with the second connector of the module socket, which is a female connector 101, and an electrical connection is established. This module socket mounts mounted module 91 on a mounting member, such as a board, not shown in the figures, and establishes an electrical connection between the module 91 and the mounting member. In this explanation of the embodiment, the male connector 1 is attached to the module 91, and the female connector 101 is attached to a mounting member such as a board.

In this embodiment, the module 91 is a camera module in which an imaging element such as a CCD or CMOS image sensor is integrated with an optical element such as a lens. However, this can be any other type of module. For example, it can be a sensor module including a sensor such as an infrared sensor or a fingerprint recording sensor, an acoustic element module such as a microphone, or a communication module for establishing wireless communication with a wireless communication network such as a wireless local area network (LAN). When the module 91 is a camera module, the upper surface in FIG. 1 is typically a light receiving surface such as a lens.

The module socket in this embodiment is used to mount the module 91 in a small electronic device such as a cell phone, PDA, gaming device, or navigation device. However, it can also be used to mount the module in household electronics or appliances such as a television, washing machine or refrigerator, or in another type of device such as a security system or an automobile. The board to which the female connector 101 is connected in this embodiment can be a printed circuit board, a flexible printed circuit (FPC) board, or a flexible flat cable (FFC).

The male connector 1 has a flat housing 11 made from an insulating material such as a resin, a conductive pad 51 serving as the first conductive pattern arranged on the mating side surface (the surface opposite that of the module 91) of the housing 11, and a protruding terminal 53 serving as the male terminal protruding from the surface of the conductive pad 51. The dimension of the housing 11 in the thickness direction is approximately from 0.3 to 0.5 mm, but this dimension can be changed if necessary.

Each conductive pad 51 is exposed on the mating side surface of the housing 11, and has a single protruding terminal 53. In the figures, the conductive pads 51 and protruding terminals 53 are arranged in two rows extending in the width direction of the male connector 1. However, the arrangement of the conductive pads 51 and the protruding terminals 53 is not limited to the example shown in the figures. This can be changed if necessary.

Each protruding terminal 53 is a component that protrudes from the surface of a conductive pad 51. They can be integrally formed with a conductive pad 51 using a method such as etching that employs photolithographic technology. The preferred dimension of the protruding terminals 53 in the height direction can be approximately from 0.1 to 0.3 mm.

Figure 2A:
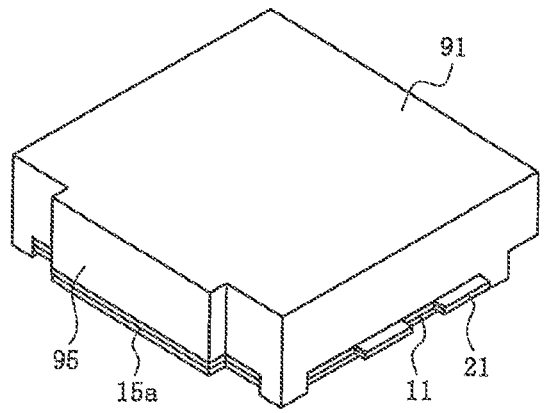
FIG. 2 illustrate views of a first connector of the module socket of FIG. 1, in which (a) is a perspective view from the module, and (b) is a perspective view from the first connector.
Figure 2B:
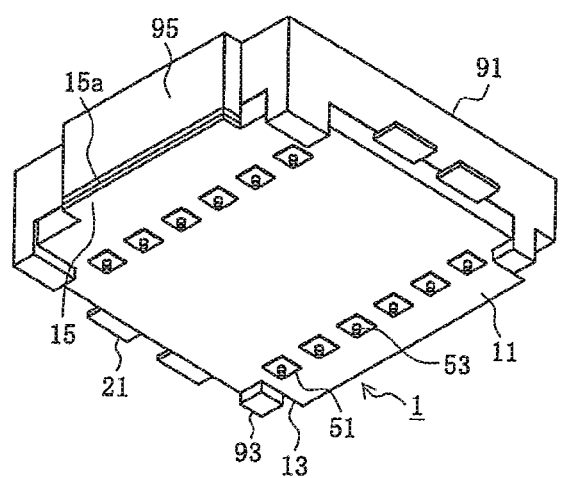

The protruding terminals 53 shown in FIG. 2 have a column shape. The terminals can have an angular column shape in which the vertical cross-section is polygonal, such as square, pentagonal, hexagonal or a rounded column shape in which the horizontal cross-section is round or oval-shaped. The protruding terminals 53 can be formed so that the diameter at the leading end is greater than that of the other portions.

The mounted side surface of the housing 11 (the surface on the module 91 side) includes an arrangement of connection pads not shown in the Figures. Each connection pad is connected electrically to a corresponding conductive pad 51 via a conductive trace not shown in the Figures which is formed so as to pass into the interior of the housing 11. Each connection pad is mechanically and electrically connected to the corresponding connection pad not shown in the figures on the bottom surface of the module 91 using a connecting means such as soldering or a conductive adhesive. In this way, as shown in FIG. 2, the male connector 1 is attached to the module 91, and the conductive pads 51 and protruding electrodes 53 are connected electrically to connection pads in the module 91.

The housing 11 has a rectangular planar shape, but cutouts 13 have been formed at the four corners to serve as mating recesses. As shown in FIG. 2, when the male connector 1 is attached to the module 91, the protruding legs 93 serving as mating protrusions protruding from the bottom surface of the module 91 are fitted into these cutouts 13 to position the male connector 1 properly with respect to the module 91. The shape, number, and arrangement of the protruding legs 93 and cutouts 13 can be changed if necessary, or they can be omitted altogether.

Ears 21 are formed as male mating locks protruding outward in the width direction are formed on the left and right side surfaces of the housing 11. In the example shown in the Figure, two ears 21 are formed on both the left and right side surfaces of the housing 11. If necessary, the number and arrangement can be changed.

A protruding stopper 15 is formed on the front end of the housing 11 as a stopping and positioning component protruding forward. The abutting end 15*a* at the front end of the protruding stopper 15 abuts the abutting end 115*a* of the front frame portion 115 in the frame 111 surrounding the female connector 101, and the male connector 1 and female connector 101 are mated. The protruding stopper is used to position the male connector 1 and the female connector 101 for this operation. Typically, as shown in FIG. 2, the abutting end 15*a* is formed to become flush with the front end surface of a protrusion 95 in the module 91.

In this embodiment, the female connector 101 is the second connector of the module socket, and has a rectangular planar shape. This establishes an electrical connection with the male connector 1 that is the first connector in this embodiment, and is mounted on the surface of a mounting member such as a board. Here, the female connector 101 has the shape of a flat plate, and is mounted so that the reverse surface faces the surface of the mounting member and an electrical connection is established with a conductive trace in the mounting member.

The female connector 101 also has a flat frame 111 whose surface shape is nearly square. This frame 111 has a front frame portion 115 and a rear frame portion 116 serving as the horizontal portions of the frame extending in the width direction of the female connector 101 (the horizontal direction in FIGS. 3(*b*) and (*c*)), and has a pair of vertical frames 112 on the left and right extending in the longitudinal direction of the female connector 101 (the vertical direction in FIGS. 3(*b*) and (*c*)), and connected to both ends of the front frame portion 115 and the rear frame portion 116.

A flat recess having a rectangular profile whose surroundings are demarcated by the frame 111 is formed as a connection recess 114 to accommodate the male connector 1. The bottom of the connection recess 114 is a flat connection sheet 150 having a layered structure in which a base film 118, a conductive pattern 151, and a cover film 117 are formed in successive order from the bottom. Compared to the connection sheet 150, the frame 111 is a thick plate-shaped component whose dimension in the thickness direction is approximately from 0.3 to 0.5 mm. If necessary, this dimension can be changed.

The conductive pattern 151 is a female conductive pattern serving as a second conductive pattern functioning as a plurality of conductive wires. This can be formed by patterning (etching, etc.) copper foil with resilience and a thickness from several micrometers to tens of micrometers.

Figure 4:
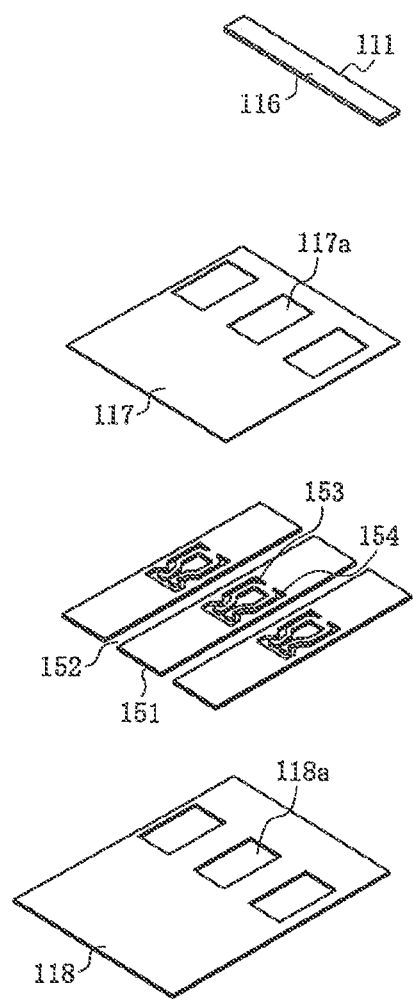
FIG. 4 is an exploded view showing the layered structure of the second connector of the module socket of FIG. 1.

FIG. 4 shows the layered structure of a portion of the female connector 101. Conductive patterns 151 extend parallel to each other in the longitudinal direction of the female conductor 101. Adjacent conductive patterns 151 are separated by a pattern separating space 152. In the example shown in the figure, the conductive patterns 151 have the shape of a narrow strip, and are arranged parallel to each other at a predetermined pitch, such as 0.1 mm.

In the Figures, 158 is a tail integrally formed in each conductive pattern 151 so as to extend forward and rearward from the front frame portion 115 and the rear frame portion 116 of the frame 111. Although not shown, these tails are connected (soldered, etc.) to connection pads formed on the surface of a mounting member not shown in the Figures. When the tails 158 are connected to connection pads, the female connector 101 is secured to the mounting member, and the conductive patterns 151 establish a connection to the corresponding conductive traces in the mounted member. Also, 159 denotes securing brackets attached to the frame 111. These are secured (soldered, etc.) to anchoring pads formed on the surface of a mounting member not shown in the Figures.

A plurality of receiving terminals 153 serving as female terminals are arranged in the conductive patterns 151 in the portion corresponding to the bottom of the connection recess 114. Because the receiving terminals 153 are mated with the protruding terminals 53 serving as male connectors 1 and establish a connection, their arrangement is similar to that of the protruding terminals 53. When the arrangement of the protruding terminals 53 is changed, the arrangement of the receiving terminals 153 is changed accordingly. Because the conductive patterns 151 also establish a connection to conductive pads 51 on the male connector 1, the arrangement of the conductive patterns is similar to the arrangement of the conductive pads 51. When the arrangement of the conductive pads 51 in the male conductor 1 is changed, the arrangement of the conductive patterns 151 is changed accordingly.

Each receiving terminal 153 accommodates a conductive pattern 151 inside a rectangular terminal accommodating opening 154 through which it passes in the thickness direction. The conductive patterns 151 can be formed, for example, using a method such as etching that employs photolithographic technology. The conductive patterns 151 are typically formed using patterning, and the remaining pattern is the receiving terminal 153. The portion surrounding the receiving terminal 153 from which material has been removed is the terminal accommodating opening 154. Therefore, the thickness dimension of the receiving terminal 153 is the same as the thickness dimension of the conductive pattern 151.

The base film 118 is a female base. This second base is a thin, insulating base that can be made of a resin such as polyimide or any other insulating material. A terminal opening 118a is formed in the base film 118. This passes through the base film 118 in the thickness direction in the position corresponding to a receiving terminal 153 formed in a conductive pattern 151. Each terminal opening 118a has a rectangular shape that is longer in the longitudinal direction so as to accommodate a receiving terminal 153.

The cover film 117 is a female cover film. This second cover film is an insulating thin film that can be made of a resin such as polyimide or any other insulating material. A terminal opening 117a is formed in the base film 117. This passes through the base film 117 in the thickness direction in the position corresponding to a receiving terminal 153 formed in a conductive pattern 151. Each terminal opening 117a has a rectangular shape that is longer in the longitudinal direction so as to accommodate a receiving terminal 153.

The base film 118, the conductive pattern 151, and the cover film 117 are layered on top of each other, and a connection sheet 150 is formed which serves as the bottom portion of the connection recess 114. A terminal accommodating opening 154 is formed in the connection sheet 150 that correspond to the terminal openings 118a in the base film 118 and the terminal opening 117a in the cover film 117. The opening passes through the connection sheet 150 in the thickness direction.

The frame 111 is layered on top of the cover film 117. The frame 111 is a thin sheet having a substantially rectangular surface shape. It can be made of any type of material, including a metal such as stainless steel or a resin such as polyimide. The material can be conductive or insulating. The frame 111 can also be constructed by layering a plurality of thin sheets on top of each other. FIG. 4 shows a section of the rear frame portion 116 of the frame 111.

The surface shape of receiving terminals 153 is one of the shapes shown in FIG. 5(*a*) through (*d*). Each receiving terminal 153 has a base 153a connected to the circumferential edge of a terminal accommodating opening 154, a pair of arms 153d connected to the base 153a, and a pair of contact portions 153c connected to the leading end of each arm 153d. The left and right arms 153d and the contact portion 153c are symmetrical with respect to each other. The arms 153d are cantilevered and function as springs. The contact portion 153c is elastically displaced in the width direction of the female connector 101 by the spring action of the arms 153d.

The terminal accommodating opening 154 includes a side opening 154a on the inside of the receiving terminal 153 and an outer opening 154b on the outside of the receiving terminal 153. When the receiving terminal 153 is mated with the protruding terminal 53 of the male connector 1, the inner opening 154a receives the advancing protruding terminal 53, and the outer opening 154b allows for the displacement of the arms 153d and the contact portion 153c.

The portion of the inner opening 154a between opposing arms 153d has a large area. Typically, the width dimension is larger than the width dimension of the leading end of the protruding terminal 53, the dimension in the longitudinal direction is greater than the dimension of the leading end of the protruding terminal 53 in the longitudinal direction. This allows the protruding terminal 53 to advance smoothly inside the inner opening 154a. The portion between opposing contact portions 153c is a space with a narrow width. Typically, the width dimension is smaller than the width direction of the protruding terminal 53. As a result, when the protruding terminal 53 accommodated inside the inner opening 154a moves relative to the contact portions 153c, the interval between the contact portions 153c abut the side surfaces of the protruding terminal 53 and are pushed apart. The spring action of the arms 153d then causes the contact portions 153c to apply pressure against the side surfaces of the protruding terminal 53. In other words, the side surfaces on both sides of the protruding terminal 53 are elastically interposed between a pair of contact portions 153c.

The shape of the inner opening 154a is such that the width dimension becomes gradually smaller as the portion between the contact portions 153c is approached. In other words, the section near the contact portions 153c on the inner edges of the opposing arms 153d is tapered. As a result, the protruding terminal 53 can advance smoothly into the section between opposing contact portions 153c.

In the example shown in FIG. 5(*a*), the planar shape of the receiving terminal 153 is symmetrical both vertically and horizontally. The receiving terminal 153 includes a base 153a with a pair of sections connected, respectively, to the left and right side edges of the terminal accommodating opening 154. The left and right sections are separate but have planar shapes that are symmetrical in the horizontal direction. The left and right sections have an arm 153d connected to the upper and lower base 153a, and a contact portion 153c connected to the leading end of the upper and lower arms 153d. This has a planar shape that is symmetrical in the vertical direction.

The terminal accommodating opening 154 includes a pair of upper and lower symmetrical inner openings 154a positioned between the left and right arms 153d, and a pair of left and right symmetrical outer openings 154b positioned to the outside of the contact portions 153c. The interval between the opposing left and right contact portions 153c is narrower than the interval between the arms 153d.

The shape of the inner opening 154a is such that the width dimension becomes gradually smaller as the portion between the contact portions 153c is approached. In other words, the section near the contact portions 153c on the inner edges of the opposing arms 153d is tapered. As a result, the protruding terminal 53 can advance smoothly into the section between opposing contact portions 153c.

In the example shown in FIG. 5(*a*), the protruding terminal 53 can advance into both the upper and lower inside openings 154a. Therefore, when the male connector 1 and the female connector 101 are mated, there is a greater degree of freedom with respect to the relative position of the male connector 1 and the female connector 101, and the mating operation is easier to perform. The upper and lower ends of the contact portions 153c are supported by arms 153d to become cantilevered beams. As a result, the spring action supporting the contact portions 153c increases, the force elastically interposing the side surfaces of the protruding terminal 53 between the pair of contact portions 153c is increased, and the contact between the side surfaces and the contact portions 153c is maintained more reliably.

In the example shown in FIG. 5(b), the receiving terminal 153 includes a base 153a with a pair of sections connected, respectively, to the left and right side edges of the terminal accommodating opening 154. The left and right sections are separate but have planar shapes that are symmetrical in the horizontal direction. The left and right sections have an arm 153d connected to the upper and lower base 153a, and a contact portion 153c connected to the leading end of the upper and lower arms 153d. This has a planar shape that is symmetrical in the vertical direction.

An upper base 153a1 is positioned near the upper edge of the terminal accommodating opening 154, and a lower base 153a2 is positioned near the middle of the terminal accommodating opening 154 in the vertical direction. The contact portion 153c is positioned from the middle of the terminal accommodating opening 154 towards the bottom. The planar shape of the upper arm 153d1 is substantially linear or elbow-shaped with a broad curve, and the planar shape of the lower arm 153d2 is J-shaped or U-shaped with a sharp curve. The inner opening 154a is positioned between the left and right upper arms 153d1.

The shape of the inner opening 154a is such that the width dimension becomes gradually smaller as the portion between the contact portions 153c is approached. In other words, the section near the contact portions 153c on the inner edges of the opposing arms 153d is tapered. As a result, the protruding terminal 53 can advance smoothly into the section between opposing contact portions 153c.

In the example shown in FIG. 5(b), the upper end of the inner opening 154a is larger than the lower end. The inner opening 154a can be larger compared to the example shown in FIG. 5(a). When the male connector 1 and the female connector 101 are mated, there is a greater degree of freedom with respect to the relative position of the male connector 1 and the female connector 101, and the mating operation is easier to perform. If the size of the inner opening 154a is similar to the example shown in FIG. 5(a), the overall size of the terminal accommodating opening 154 can be smaller, and the terminal accommodating opening 154 and the receiving terminal 153 can be arranged more tightly. Because the length of the upper and lower arms 153d, that is, the length of the springs, is longer, the range in which the contact portions 153c can be elastically displaced is greater. This can accommodate changes in the width dimension of the side surfaces of the protruding terminal 53 within a wider range, and the contact between the side surfaces and the contact portions 153c is maintained more reliably.

In the examples shown in FIGS. 5(c) and (d), the receiving terminal 153 includes a base 153a with a pair of sections connected, respectively, to the left and right side edges of the terminal accommodating opening 154. The left and right sections are separate but have planar shapes that are symmetrical in the horizontal direction. The left and right sections have an arm 153d connected to the upper and lower base 153a, and a contact portion 153c connected to the leading end of the upper and lower arms 153d. This has a planar shape that is symmetrical in the vertical direction.

An upper base 153a1 is positioned near the upper edge of the terminal accommodating opening 154, and a lower base 153a2 is positioned near the middle of the terminal accommodating opening 154 in the vertical direction. The contact portion 153c is positioned from the middle of the terminal accommodating opening 154 towards the bottom. The planar shape of the upper arm 153d1 is substantially linear or elbow-shaped with a broad curve, and the planar shape of the lower arm 153d2 is S-shaped or N-shaped with a sharp curve. The inner opening 154a is positioned between the left and right upper arms 153d1.

In the examples shown in FIGS. 5(c) and (d), the length of the lower arm 153d2, that is, the length of the spring, is longer. As a result, changes in the width dimension of the side surfaces of the protruding terminal 53 can be accommodated within a wider range. Because the other points are similar to those in the example shown in FIG. 5(b), further explanation has been omitted.

Figure 3A:
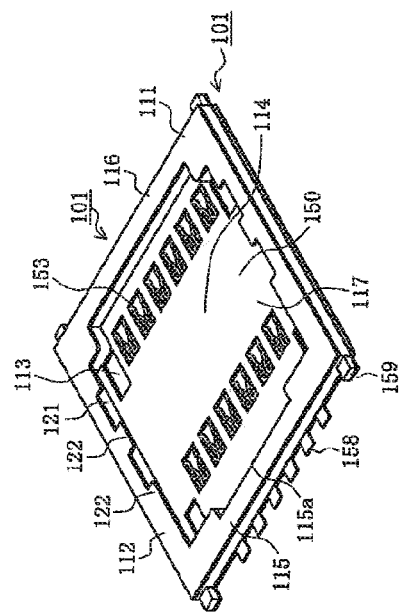
FIG. 3 illustrate views of a second connector of the module socket of FIG. 1, in which (a) is perspective view, (b) is a top view and (c) is a bottom view.
Figure 3B:
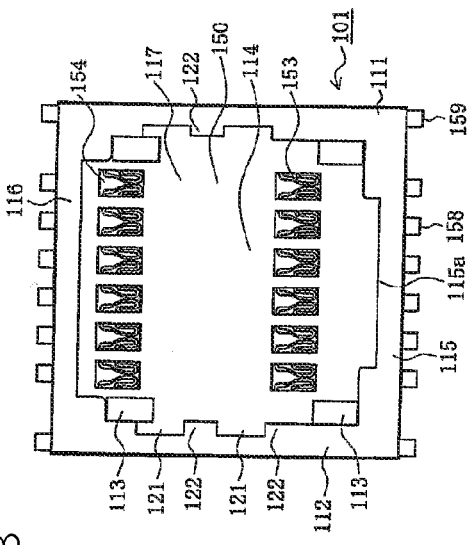
Figure 3C:
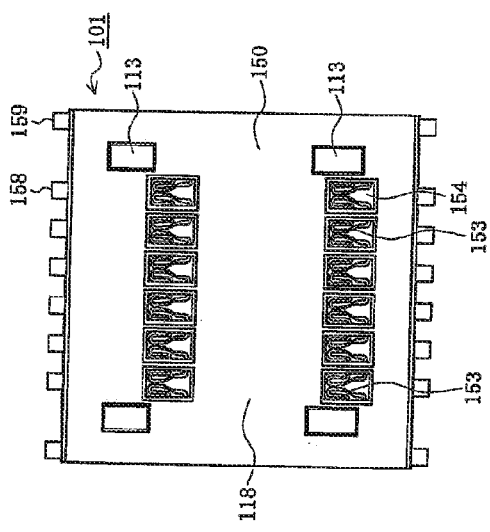

As shown in FIG. 3, receiving recesses 121 for receiving and engaging the ears 21 on the housing 11 of the male connector 1 are formed on the inside of the opposing vertical frame portions 112 of the frame 111. When the male connector 1 and the female connector 101 are mated, first, as shown in FIG. 1(a), the ears 21 on the housing 11 are accommodated in the corresponding receiving recesses 121 in the frame 111. In the example shown in the figure, there are two receiving recesses 121 on the left and right vertical frame portions 112. However, the number and arrangement can be changed to match the number and arrangement of the corresponding ears 21.

The portion of the left and right vertical frame portions 112 between the receiving recesses 121 functions as a female mating lock 122. When the male connector 1 and the female connector 101 are mated, the male connector 1 advances towards the female connector 101 from the position shown in FIG. 1(a). In other words, it slides forward to the position shown in FIG. 1(b). At this time, the ears 21 on the housing 11 move downward into the corresponding female mating locks 122 of the frame 111, and engage. This locks the mated male connector 1 and female connector 101.

The front frame portion 115 functions as a positioning component for positioning the male connector 1 with respect to the female connector 101. A recess is formed on the inside, or rear side, of the front frame portion 115 opposite the rear frame portion 116, and the inside of this recess functions as an abutting end 115a. When the abutting end 115a abuts the abutting end 15a at the front end of the protruding stopper 15 on the male connector 1, the male connector 1 and the female connector 101 are positioned, and the male connector 1 and the female connector 101 are then mated.

A protruding leg opening 113 is formed in the connection sheet 150 at a position corresponding to a protruding leg 93 protruding from the bottom surface of the module 91, and the opening passes through the connection sheet 150 in the thickness direction. When the male connector 1 and the female connector 101 are mated, at least the leading end of each protruding leg 93 is accommodated inside a corresponding protruding leg opening 113. The dimension of each protruding leg opening 113 in the longitudinal direction is greater than the dimension of the corresponding protruding leg 93 in the longitudinal direction. In this way, the male connector 1 can slide forward into the female connector 101 when at least the leading end of each protruding leg 93 has been accommodated inside the corresponding protruding leg opening 113.

Figure 6A:
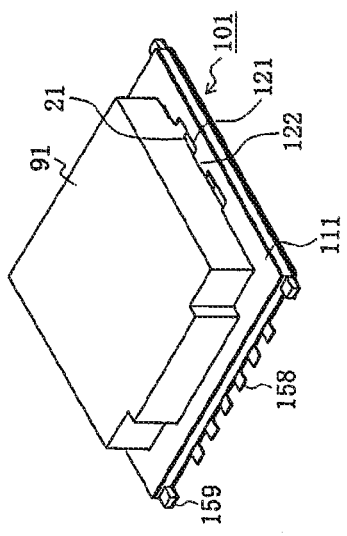
FIG. 6 is a view of mating steps of the first and second connectors of FIG. 1.
Figure 6B:
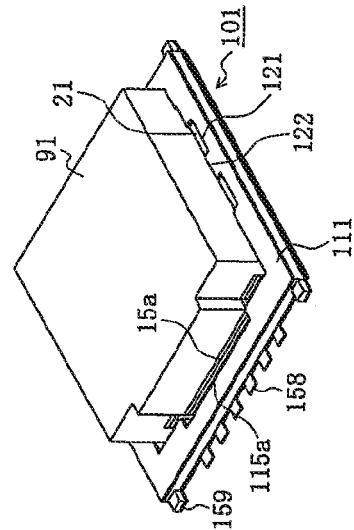
Figure 6C:
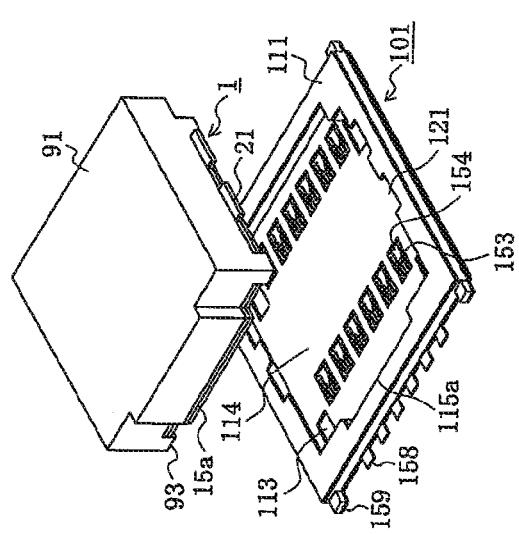
Figures 7A, 7B, 7C:
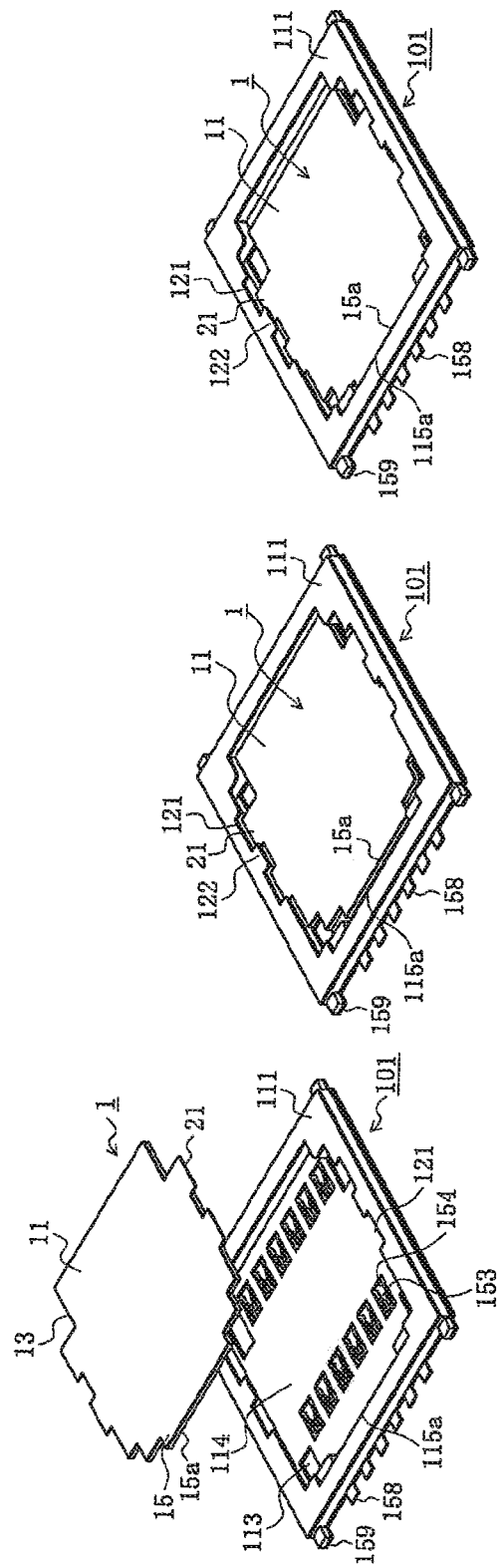
FIG. 7 is a view of further mating steps of the first and second connectors of FIG. 1.

FIGS. 6-8 illustrate the mating operation for the male connector 1 and the female connector 101 in this configuration. Here, the tails 158 are connected to connection pads formed on the surface of a mounting member such as a board not shown in the figures using, for example, soldering, to surface-mount the female connector 101 on the mounting member. The female connector 101 is mounted so that the rear surface faces the surface of the mounting member. The mounting member can be a printed circuit board, flexible circuit board, flexible flat cable, or other type of member used in an electronic device such as a personal computer, cell phone, PDA, digital camera, music player, gaming device, or navigation device, or in an electric device such as a household appliance.

First, as shown in FIG. 6(*a*) and FIG. 7(*a*), the operator orients the male connector 1 attached to a module 91 so that the surface on which the protruding terminals 53 have been formed is facing the surface of the female connector 101, that is, so that the surface of the male connector 1 is facing the surface of the female connector 101. It is also oriented so that the ears 21 in the housing 11 match up with the receiving recesses 121 in the frame 111. In this posture, the male connector 1 is positioned directly above the female connector 101.

FIG. 7(*a*) through (*c*) show steps corresponding to FIG. 6(*a*) through (*c*). In order to illustrate the relationship between the male connector 1 and the female connector 101, the module 91 has been omitted. A plurality of connection pads are arranged on the mounting surface of the housing 11 of the male connector 1 (the upper surface in FIG. 7). These connection pads are connected mechanically and electrically to connection pads formed on the bottom surface of the module 91. These connection pads have been omitted from the figure.

Next, the operator lowers the male connector 1 towards the female connector 101, that is, in the mating direction. As shown in FIG. 6(*b*) and FIG. 7(*b*), the mating surface of the male connector 1 is opposed to the mating surface of the female connector 101 so that the male connector 1 is accommodated inside the connection recess 114 of the female connector 101, and the connectors are brought into contact or brought closer to each other. The ears 21 on the housing 11 advance into the receiving recesses 121 of the frame 111. Also, each protruding terminal 53 advances into the inner opening 154*a* of the corresponding receiving terminal 153.

Next, the operator slides the male connector 1 relative to the female connector 101 in the locking direction. In other words, the surface of the male connector 1 abuts the surface of the female connector 101, and the male connector 1 advances relative to the female connector 101 in the forward direction (towards the lower left in FIG. 6(*b*) and FIG. 7(*b*)). At this time, each protruding terminal 53 enters the inner opening 154*a* of the corresponding receiving terminal 153, and the left and right ears 21 are guided into the left and right receiving recesses 121. In this way, the male connector 1 maintains the proper posture relative to the female connector 101.

When the mating of the male connector 1 and the female connector 101 has been completed as shown in FIG. 6(*c*) and FIG. 7(*c*), the left and right ears 21 in the male connector 1 engage the female mating locks 122 in the left and right vertical frame portions 112 of the female connector 101. More specifically, at least a portion of the ears 21 moves downward into the corresponding female mating lock 122 in the frame 111 and becomes engaged. In this way, the male connector 1 and female connector 101 are locked in the mated state.

Because there is an abutting end 15*a* on the protruding stopper 15 in the housing 11 of the male connector 1, and the abutting end 15*a* abuts the abutting end 115*a* in the frame 111 of the female connector 101 even when the male connector 1 is sliding in the locking direction, excessive advancement of the male connector 1 relative to the female connector 101 can be stopped. This positions the male connector 1 and the female connector 101 properly.

When the male connector 1 has slid forward relative to the female connector 101 in the locking direction, the protruding terminals 53 advance into the inner openings 154*a* of the receiving terminals 153 and move relative to the inner openings 154*a* between opposing contact portions 153*c* as shown in FIG. 8. The side surfaces of the protruding terminal 53 abut and push apart the contact portions 153*c*, and the contact portions 153*c* press against the side surfaces of the protruding terminal 53 due to the spring action of the arms 153*d*. In other words, the side surfaces of the protruding terminal 53 are elastically interposed between a pair of contact portions 153*c* on both sides. By interposing the side surfaces of the protruding terminals 53 between contact portions 153*c*, the connectors are kept in a mated state.

The receiving terminals 153 are thin components. As shown in FIG. 8(*c*), the thickness dimension of the receiving terminals 153 is smaller than the height dimension of the protruding terminals 53. Thus, even when there is a positional disparity between the protruding terminals 53 and the receiving terminals 153 in the mating direction of the male connector 1 and the female connector 101 due to dimensional errors (tolerances) between components or shape distortions, all of the protruding terminals 53 are able to reliably advance into the inner openings 154*a* of their respective receiving terminals 153, and reliably contact can be made between the side surfaces of the protruding terminals 53 and the contact portions 153*c*.

The width dimension of the inner opening 154*a* becomes gradually smaller as the portion between the contact portions 153*c* is approached. As a result, when the protruding terminal 53 moves into the receiving terminal 153 and advances between the opposing contact portions 153*c*, the process is smooth, and the contact portions 153*c* can be pushed apart.

The operation performed to release the male connector 1 and the female connector 101 from the mated state is the opposite of the operation performed to mate the male connector 1 and the female connector 101. Therefore, further explanation of this operation has been omitted.

In this embodiment, the module socket has a plate-shaped male connector 1 including a plate-shaped housing 11, conductive pads 51 arranged on the mating side surfaces of the housing 11, and protruding terminals 53 protruding from the surface of the conductive pads 51, and a female connector 101 including receiving terminals 153 for elastically interposing the protruding terminals 53. The male connector 1 or the female connector 101 is attached to a module 91, and the other is connected to the mounting member.

In this way, the dimensions of the module socket can be reduced in the vertical, horizontal, and height directions. Also, contact between the protruding terminals 53 and receiving terminals 153 remains stable. Because the manufacturing process is easier and the configuration is simpler, costs can be reduced, and the unit is more compact and reliable.

The male connector 1 and the female connector 101 are mated by arranging the connectors so that their mating side surfaces face each other and then sliding the connectors together. As a result, a module 91 can be mounted on a mounting member more easily and more reliably.

Also, each receiving terminal 153 is formed by patterning a conductive pattern 151 in plate-shaped metal, and includes an inner opening 154*a* formed on the inside, a base 153*a* connected to a portion of the conductive pattern 151 surrounding the receiving terminal 153, a pair of contact portions 153*c* facing each other, and an arm 153*d* connecting the contact portions 153*c* and the base 153*a*. The interval between the pair of opposing contact portions 153*c* is smaller than the width dimension of the inner opening 154*a* and the width dimension of a protruding terminal 53. When a receiving terminal 153 engages a protruding terminal 53, the pair of contact portions 153*c* elastically interposes the protruding terminal 53 from both sides. This reliably prevents short circuiting. Because the width of the inner opening 154*a* is greater than the interval between the contact portions 153c, the protruding terminal 53 can be easily inserted into the inner opening 154a, and the mating operation for the male connector 1 and the female connector 101 can be easily performed.

The female connector 101 includes a surrounding frame 111, and a flat connection recess 114 demarcated by the surrounding frame 111. The male connector 1 is accommodated in this connection recess 114. This makes the mating operation for the male connector 1 and the female connector 101 easier and more reliable.

The male connector 1 includes ears 21 extending outward in the width direction, and the ears 21 engage female mating locks 122 formed in the frame 111 to lock the mated male connector 1 and female connector 101. In this way, the male connector 1 and the female connector 101 can be reliably locked.

FIGS. 9-12 illustrate a second embodiment of the Present Disclosure. The structural elements similar to those in the first embodiment are denoted by the same reference numbers, and further explanation of these structural elements has been omitted. Further explanation of operations and effects similar to those of the first embodiment has also been omitted.

In this embodiment, the female connector 101 does not have a frame 111. The connection sheet 150 has a flat rectangular shape, receiving recesses 121 are formed on both the left and right sides, and female mating locks 122 are formed inside the receiving recesses 121 which protrude outward in the width direction from the side surfaces. The female mating locks 122 can be integrally formed with configurational elements of the connection sheet 150, such as the cover film 117 and the base film 118. It can also be formed separately and secured to the connection sheet 150. The female mating locks 122 include an end surface 122a that is substantially perpendicular to the mating side surface of the connection sheet 150, and extends in a direction parallel to the width direction of the female connector 101.

Because the other configurational elements of the female connector 101 are similar to those of the first embodiment, further explanation of these configurational elements has been omitted.

The male connector 1 does not have protruding stoppers 15 or ears 21. Also, male mating locks 22 are arranged on the left and right mating surfaces of the housing 11. The male mating locks 22 protrude from the mating side surfaces of the housing 11, and have male tiered portions 23 formed on rear surface (the surface facing the mating side surface of the housing 11). The male tiered portions 23 are formed to receive some of the side surface on the front end of the male mating locks 22. They include tiered end surfaces 23a that are substantially perpendicular to the mating side surface of the housing 11 and that extend in a direction parallel to the width direction of the male connector 1.

The other configurational elements of the male connector 1 are similar to those in the first embodiment, so further explanation has been omitted.

In this embodiment, when the male connector 1 and the female connector 101 are mated, the operator lowers the male connector 1 towards the female connector 101, that is, in the mating direction. The mating surface of the male connector 1 is brought into contact with the mating surface of the female connector 101 so that each male mating lock 22 advances into the corresponding receiving recess 121. At this time, each protruding terminal 53 enters the inner opening 154a inside the corresponding receiving terminal 153. Afterwards, the male connector 1 and the female connector 101 are in the state shown in FIG. 9(a) and FIG. 10.

Next, the operator slides the male connector 1 relative to the female connector 101 in the locking direction. In other words, the surface of the male connector 1 abuts the surface of the female connector 101, and the male connector 1 advances relative to the female connector 101 in the forward direction (towards the lower left in FIG. 9(a)). At this time, each protruding terminal 53 enters the inner opening 154a of the corresponding receiving terminal 153, and the left and right male mating locks 22 are guided into the left and right receiving recesses 121. In this way, the male connector 1 maintains the proper posture relative to the female connector 101.

Figure 9A:
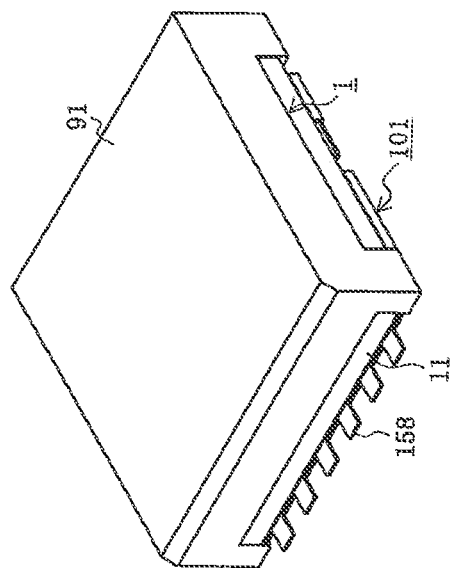
FIG. 9 is a perspective view of a module mounted in the module socket according to the Present Disclosure, in which (a) shows the module before mating has been completed, and (b) shows the module after mating has been completed.
Figure 9B:
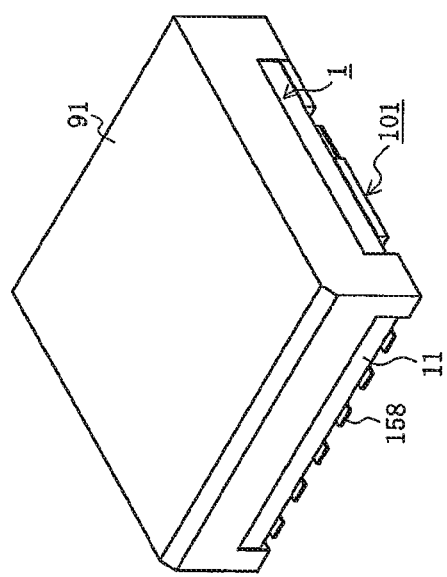
Figure 10A:
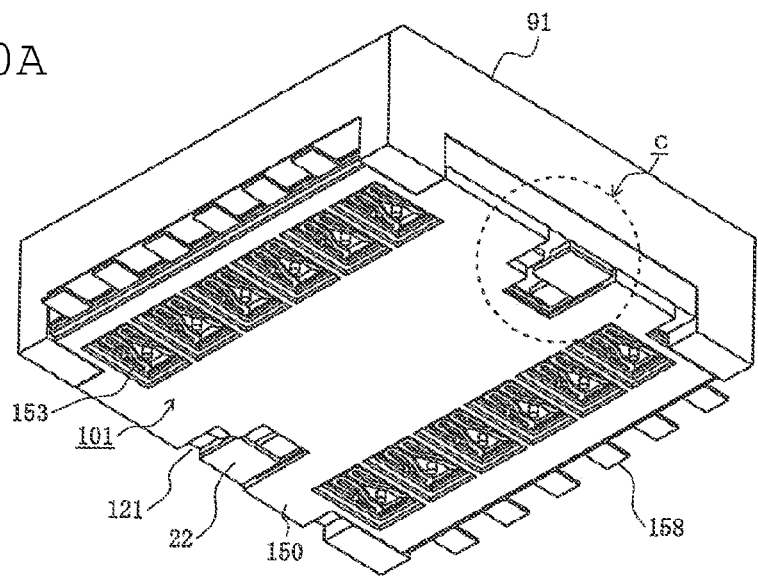
FIG. 10 is a perspective view showing the state before mating of the module socket of FIG. 9 has been completed, in which (a) is a perspective view from the second connector, and (b) is an enlarged view of Section C in (a)
Figure 10B:
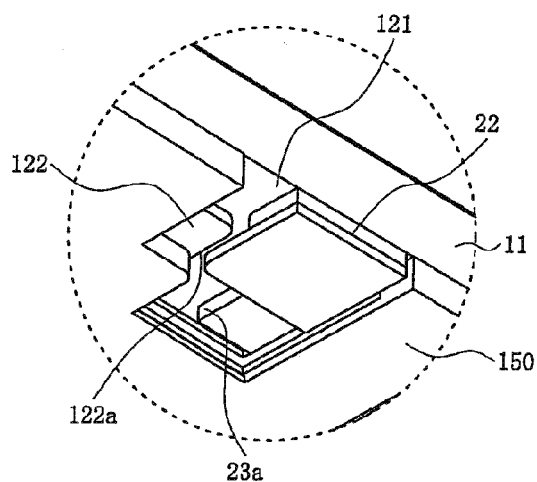
Figure 11A:
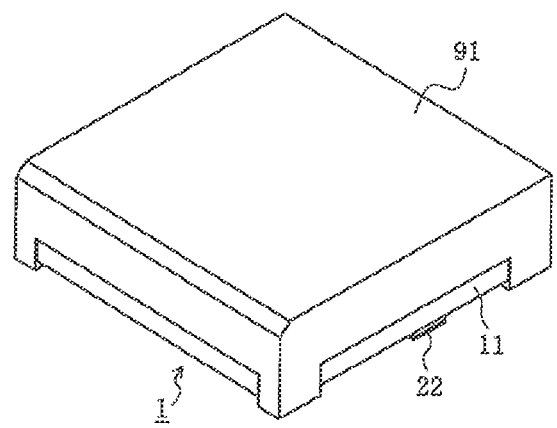
FIG. 11 is a perspective view showing a first connector of the module socket of FIG. 9, in which (a) is a perspective view from the module, (b) is a perspective view from the first connector, and (c) is an enlarged view from Section D in (b)
Figure 11B:
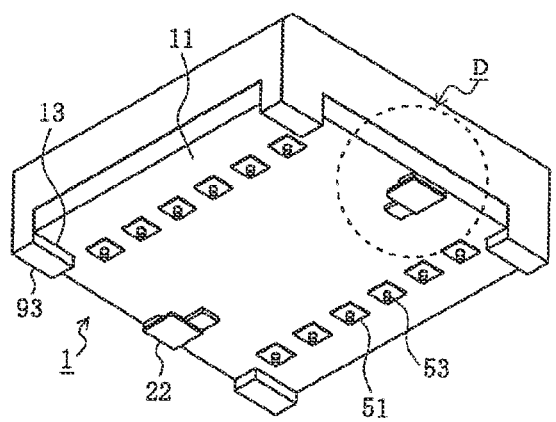
Figure 11C:
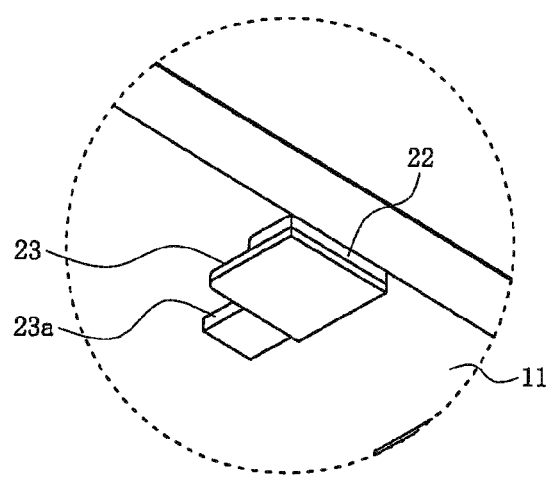
Figure 12:
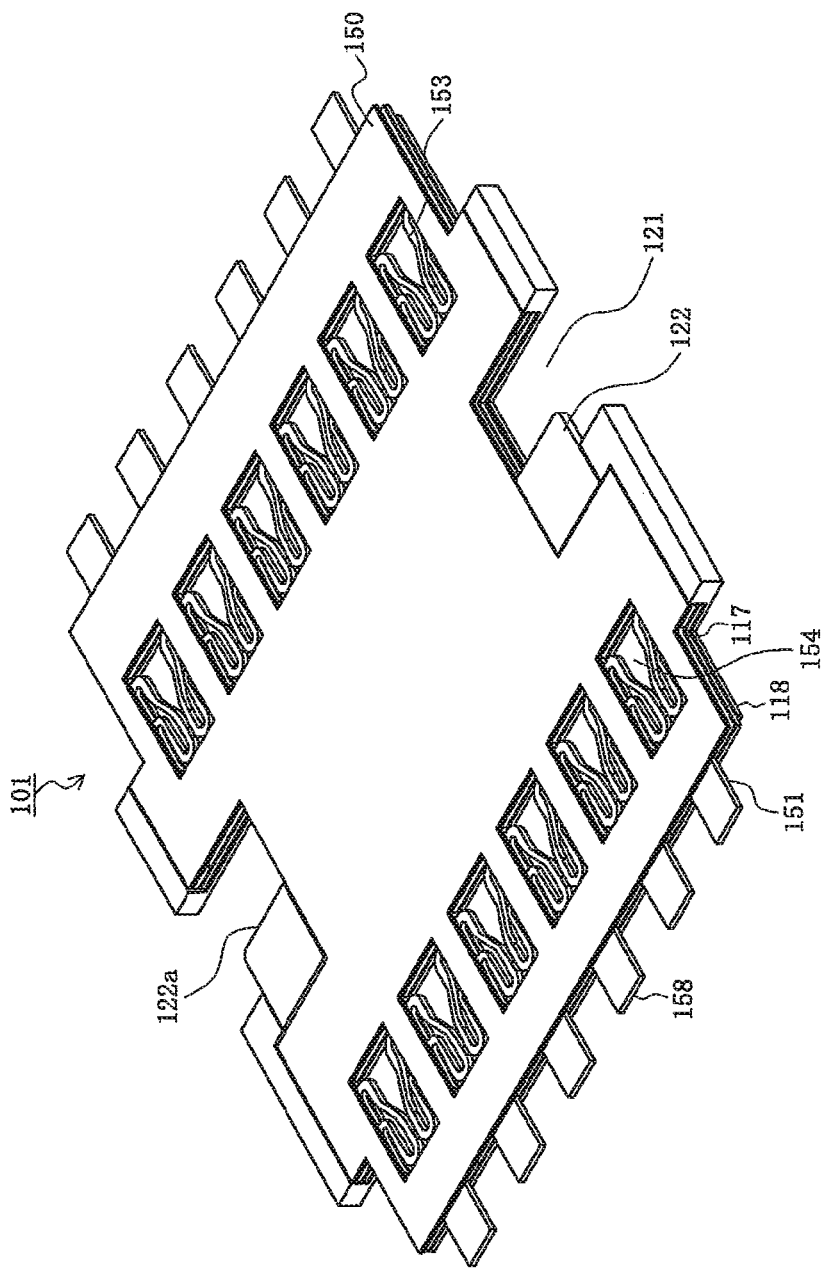
FIG. 12 is a perspective view of a second connector of the module socket of FIG. 9.

When the mating of the male connector 1 and the female connector 101 has been completed as shown in FIG. 9(b), the left and right male mating locks 22 in the male connector 1 engage the female mating locks 122 in the left and right vertical frame portions 112 of the female connector 101. More specifically, a portion of the female mating locks 122 corresponding to the frame 111 enters the male tiered portions 23 and becomes engaged. In this way, the male connector 1 and female connector 101 are locked in the mated state. When the end surfaces 122a of the female mating locks 122 abut the tier end surfaces 23a, the forward advance of the male connector 1 relative to the female connector 101 stops, and the male connector 1 and the female connector 101 are positioned properly.

Because the other configurational elements and operations of the module socket in this embodiment are the same as those in the first embodiment, further explanation has been omitted.

In this embodiment, the female connector 101 does not include a surrounding frame 111, but the male connector 1 includes male mating locks 22 protruding from the mating side surface. The male mating locks 22 engage the female engaging locks 122 formed in the female connector 101, and the male connector 1 and the female connector 101 are locked in the mated state. As a result, the structure of the female connector 101 can be simplified, and costs reduced. Because the female connector 101 does not include a frame 111, the overall dimensions of the module socket can be reduced in the vertical and horizontal direction.

Figure 13:
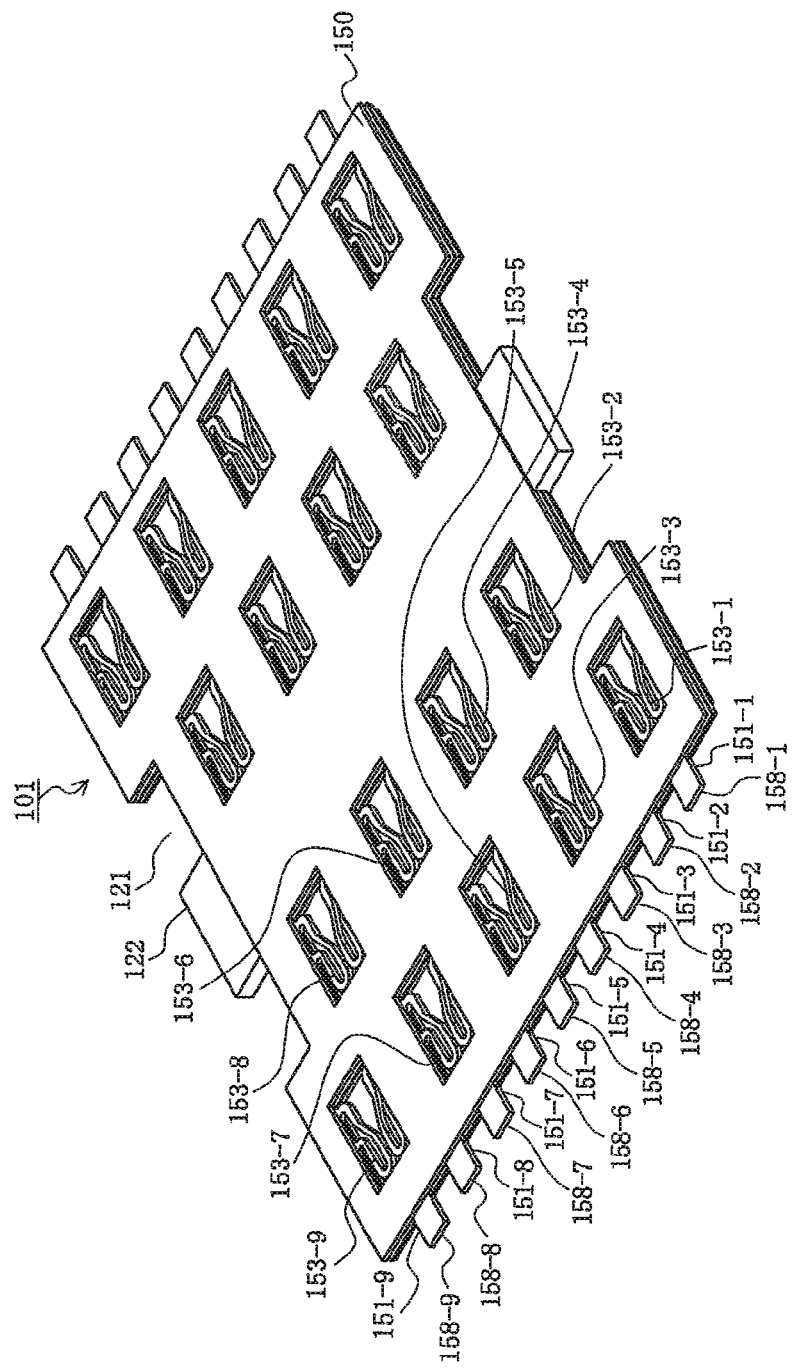
FIG. 13 is a perspective view of a second connector of a module socket according to the Present Disclosure.

FIG. 13 illustrates the third embodiment of the Present Disclosure. The structural elements similar to those in the first and second embodiments are denoted by the same reference numbers, and further explanation of these structural elements has been omitted. Further explanation of operations and effects similar to those of the first and second embodiments has also been omitted.

In this embodiment, a plurality of receiving terminals 153 are arranged in a plurality of rows extending in the width direction of the female connector 101 in the portion towards the front end of the female connector 101 (the upper right end in the figure) and in the portion towards the rear end (the lower left end in the figure). Also, the receiving terminals 153 are arranged relative to the width direction of the female connector 101 at a half pitch with respect to the terminals in the adjacent row. In other words, the arrangement of the receiving terminals 153 is staggered. In the example shown in the figure, there are two rows in each portion. However, there can be three or more rows in each portion if necessary.

In the example shown in the figure, the receiving terminals 153 arranged in the rear end portion, the conductive patterns 151 in the receiving terminals 153, and the tails 158 of the conductive patterns 151 are numbered sequentially one to nine from right to left. The odd-numbered conductive patterns 151, that is, the receiving terminals 153 with the odd-numbered conductive patterns 151, form the first row farthest to the rear, and the even-numbered conductive patterns 151, that is, the receiving terminals 153 with the even-numbered conductive patterns 151, form the second row.

Here, the portion connecting the receiver terminal 153 and the tail 158 in the even-numbered conductive patterns 151 is narrow so as to be able to pass between the receiving terminals 153 of adjacent odd-numbered conductive patterns 151. The dimension of the odd-numbered conductive patterns 151 in the longitudinal direction is shorter than the dimension of the even-numbered conductive patterns 151 in the longitudinal direction.

The receiving terminals 153 arranged in the portion towards the front of the connector, the conductive patterns 151 in the receiving terminals 153, and the tails 158 of the conductive patterns 151 are similar. The arrangement of receiving terminals 153 and the number of conductive patterns 151 can be changed if necessary.

An explanation of the male connector 1 was omitted in this embodiment, but the number and arrangement of the protruding terminals 53 in the male conductor 1 are altered in accordance with the number and arrangement of receiving terminals 153.

Because the other configurational elements and operations of the module socket in this embodiment are the same as those in the first and second embodiments, further explanation has been omitted.

A larger number of receiving terminals 153 and protruding terminals 53 were arranged in this embodiment. As a result, it can be adapted for use with a module 91 having a larger number of terminals.

Figure 14A:
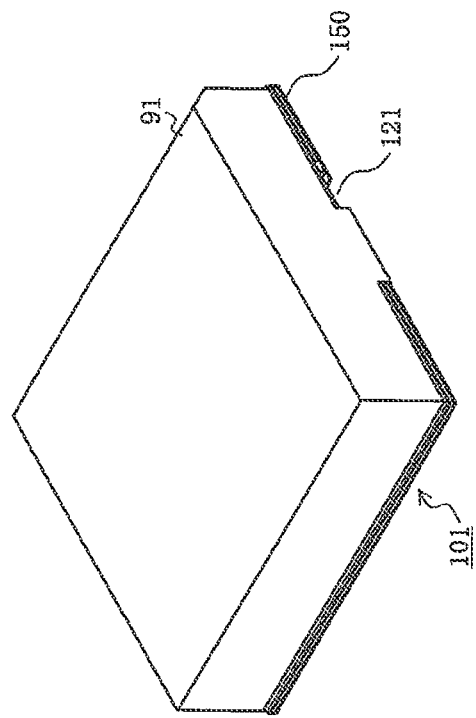
FIG. 14 is a perspective view showing a second connector of a module socket according to the Present Disclosure, in which (a) is a perspective view from the module, and (b) is a perspective view from the first connector.
Figure 14B:
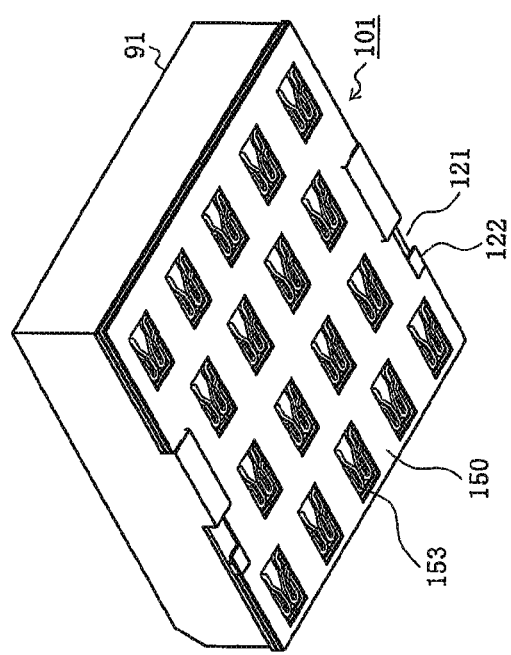

FIGS. 14-5 illustrate the fourth embodiment of the Present Disclosure. The structural elements similar to those in the first through third embodiments are denoted by the same reference numbers, and further explanation of these structural elements has been omitted. Further explanation of operations and effects similar to those of the first through third embodiments has also been omitted.

In this embodiment, the first connector or male connector 1 is attached to a mounting member such as a board, and the second connector or female connector 101 is attached to a module 91. As shown in FIG. 14, the female connector 101 does not have a frame 111. Also, a connection sheet 150 with a flat rectangular shape is attached to the bottom surface of the module 91. A portion of each conductive pattern 151 is exposed on the mounted surface of the connection sheet 150 (the surface on the module 91 side), and functions as a connection pad. Each connection pad is mechanically and electrically connected to the corresponding connection pad not shown in the figures on the bottom surface of the module 91 using a connecting means such as soldering or a conductive adhesive. In this way, the female connector 101 is attached to the module 91, and the receiving terminals 153 are connected electrically to the connection pads of the modules 91. The conductive patterns 151 in this embodiment do not have tails 158.

Figure 15A:
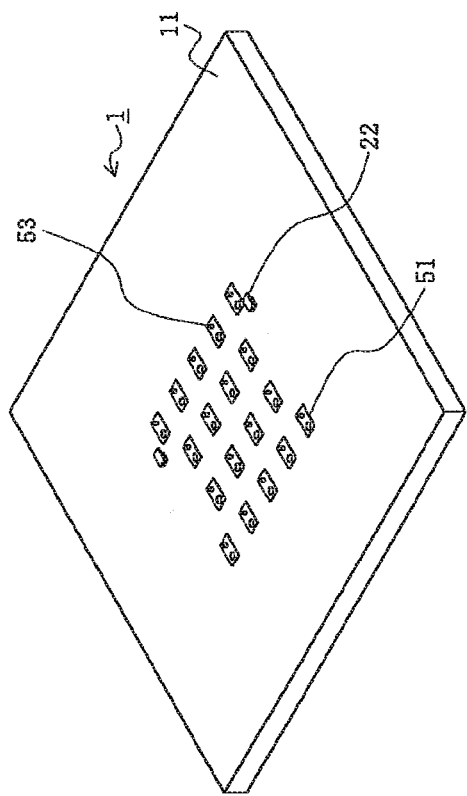
FIG. 15 is a perspective view of the first connector of the module socket of FIG. 14, in which (a) is a perspective view, (b) is a top view and (c) is a side view.
Figure 15B:
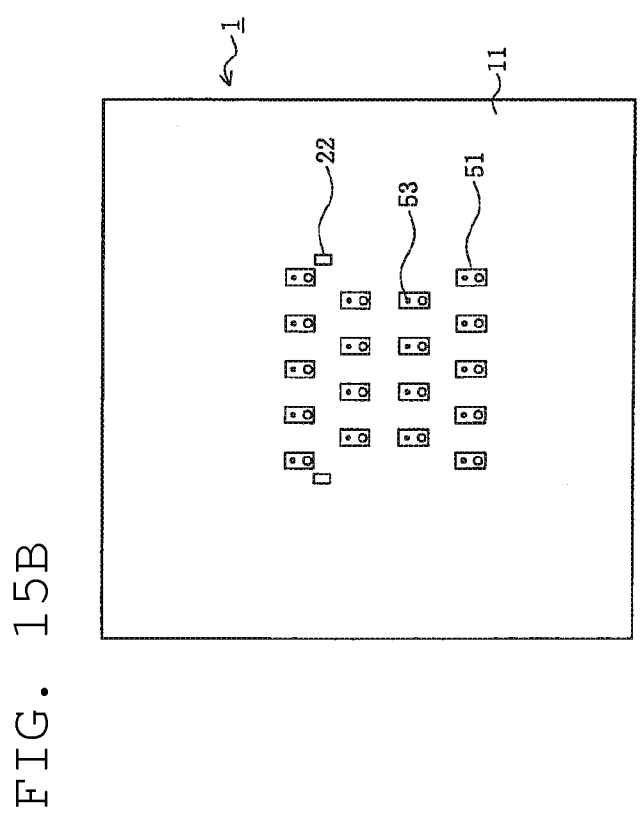
Figure 15C:
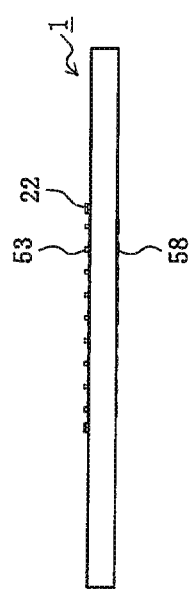
Figure 16:
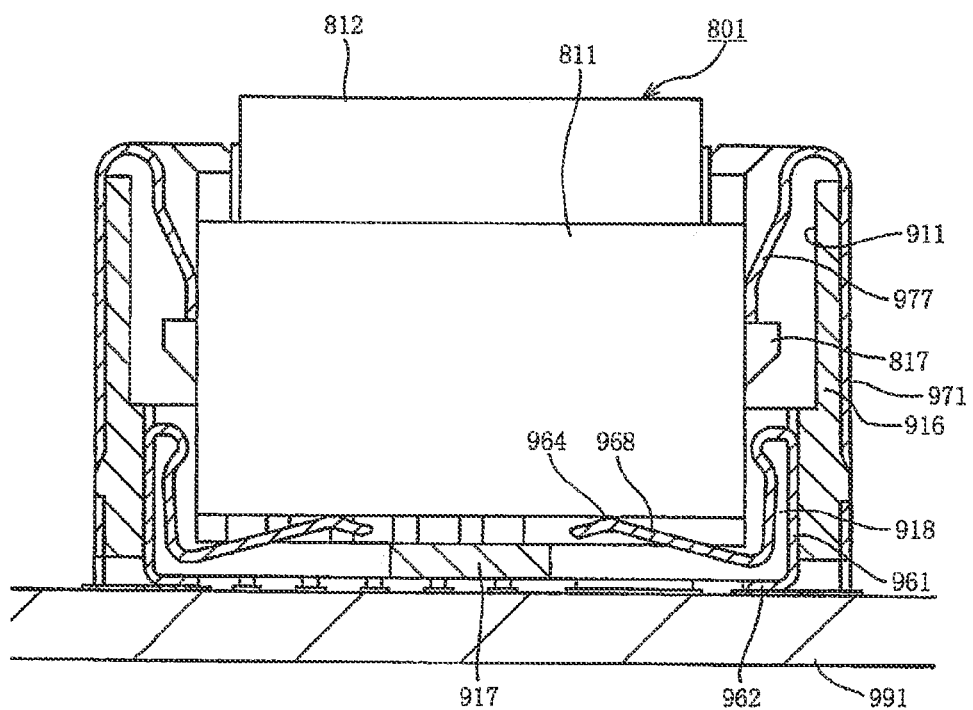
FIG. 16 is a cross-sectional view of a conventional module socket.

Also, as shown in FIG. 15, the male connector 1 is made of an insulating material such as reason, and has a flat plate-shaped housing 11 with flat, substantially rectangular shaped conductive pads 51 as first conductive patterns arranged on the mating surface of the housing 11 (the upper surface in FIG. 15(c)), protruding terminals 53 as the male terminals protruding from the surface of the conductive pad 51, and male mating locks 22.

A plurality of connection pads 58 are arranged on the mounting surface of the housing 11 (the surface on the mounting member side). Each connection pad 58 is electrically connected to a corresponding conductive pad 51 via a conductive trace not shown in the figured formed so as to pass into the housing 11. Each connection pad 58 is connected to a connection pad formed on the surface of the mounting member not shown in the figure using, for example, soldering. By connecting the connection pads 58 to the connection pads on the mounting member, the male connector 1 is secured to the mounting member, and the conductive pads 51 and the protruding terminals 53 establish an electrical connection with the corresponding conductive trace in the mounting member. The number and arrangement of protruding terminals 53 and receiving terminals 153 can be changed if necessary.

Because the other configurational elements and operations of the module socket in this embodiment are the same as those in the first through third embodiments, further explanation has been omitted.

In this embodiment, the male connector 1 is attached to the mounting member, and the female connector 101 is attached to the module 91. As a result, the module socket can be used to mount a wider variety of modules 91.

While a preferred embodiment of the Present Disclosure is shown and described, it is envisioned that those skilled in the art may devise various modifications without departing from the spirit and scope of the foregoing Description and the appended Claims.

What is claimed is:

1. A module socket for mounting a module on a mounting member, the module socket comprising:
    a first connector, the first connector including a flat housing;
    a first conductive pattern, the first conductive pattern being arranged on a mating side surface of the flat housing;
    a male terminal, the male terminal protruding from a surface of the first conductive pattern; and
    a flat second connector, the second connector being formed from plate-shaped metal and including a female terminal, the female terminal elastically interposing the male terminal and formed by patterning a second conductive pattern in plate-shaped metal, the female terminal including an inner opening formed on the inside thereof and a base connected to a portion of the second conductive pattern surrounding the female terminal;
    wherein:
        one of the first connector or the second connector is attached to the module, and the other is attached to the mounting member;
        the connectors are mated by sliding, after the mating surfaces thereof face each other.

2. The module socket of claim 1, wherein the female terminal further includes a pair of contacts facing each other.

3. The module socket of claim 2, wherein the female terminal further includes an arm, the arm connecting the contacts to the base.

4. The module socket of claim 3, wherein the interval between the pair of contacts facing each other is smaller than the width dimension of the inner opening and the width dimension of the male terminal.

5. The module socket of claim 4, wherein the male terminal is elastically interposed on both sides by the pair of contacts when the female terminal engages the male terminal.

6. The module socket of claim 5, wherein the second connector includes a frame surrounding the periphery.

7. The module socket of claim 6, wherein the second connector further includes a flat connection recess, the recess having a periphery demarcated by the frame.

8. The module socket of claim 7, wherein the first connector is accommodated in the connection recess.

9. The module socket of claim 1, wherein the first connector further includes a male mating lock, the male mating lock protruding outward in the width direction.

10. The module socket of claim 9, wherein the male mating lock engages a female mating lock formed in the frame.

11. The module socket of claim 10, wherein the first connector and second connector are locked.

12. The module socket of claim 11, wherein the second connector does not include a frame surrounding the periphery.

* * * * *